(12) United States Patent
Tsuchiya

(10) Patent No.: US 8,040,184 B2
(45) Date of Patent: Oct. 18, 2011

(54) CLASS-D AMPLIFIER

(75) Inventor: Hirotoshi Tsuchiya, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/660,368

(22) Filed: Feb. 25, 2010

(65) Prior Publication Data
US 2010/0219891 A1 Sep. 2, 2010

(30) Foreign Application Priority Data
Feb. 27, 2009 (JP) .................................. 2009-045306

(51) Int. Cl.
*H03F 3/217* (2006.01)
(52) U.S. Cl. ...................... 330/251; 330/207 A; 330/10
(58) Field of Classification Search .................. 330/251, 330/207 A, 10
See application file for complete search history.

(56) References Cited

U.S. PATENT DOCUMENTS

| 5,815,581 | A  | * | 9/1998 | Andersson | ................ | 381/321 |
| 7,167,046 | B2 | * | 1/2007 | Maejima | ................ | 330/207 A |
| 7,482,870 | B2 | * | 1/2009 | Maejima et al. | ........... | 330/207 P |
| 2007/0103234 | A1 |  | 5/2007 | Maejima et al. | | |

FOREIGN PATENT DOCUMENTS

| JP | 2006262104 | 9/2006 |
| JP | 2007124624 | 5/2007 |
| JP | 2007124625 | 5/2007 |
| KR | 2007-0036008 | 4/2007 |

OTHER PUBLICATIONS

Korean Intellectual Property Office "Notice of Submission of Argument" re Application No. 10-2010-0017903 dated Apr. 25, 2011, 3 pages.

* cited by examiner

*Primary Examiner* — Henry K Choe
(74) *Attorney, Agent, or Firm* — Pillsbury Winthrop Shaw Pittman LLP

(57) ABSTRACT

A class-D amplifier includes a differential integrator that integrates a difference between an input signal and a feedback signal to output an integration value signal, a pulse width modulation circuit that outputs a digital signal having a pulse width corresponding to a level of the integration value signal, an output buffer that drives a load based on the digital signal, a feedback section that feeds an output signal of the output buffer into the differential integrator as the feedback signal, a clamp section that performs a clamping of limiting the level of the integration value signal within a specified level range, an attenuation section that attenuates the level of the input signal to be input to the differential integrator in response to an attenuation command, and an attenuation control section that outputs the attenuation command to the attenuation section in response to the clamping performed by the clamp section.

7 Claims, 3 Drawing Sheets

CLASS-D AMPLIFIER

BACKGROUND

This invention relates to a class-D amplifier suited for a power amplifier of an audio apparatus, etc.

A class-D amplifier is an amplifier for generating a pulse train with the pulse width or the pulse time density demodulated in response to an input signal and driving a load according to the pulse train. This class-D amplifier is often used as a power amplifier for driving loudspeakers in an audio apparatus, etc. Patent Documents 1 to 3 disclose each a class-D amplifier including a differential integrator for integrating differences of an input signal and a feedback signal output from the class-D amplifier, and a pulse width modulation circuit for generating a pulse having the pulse width corresponding to the level of an integration value signal output from the differential integrator. The class-D amplifier drives a load based on an output pulse of the pulse width modulation circuit.

[Patent document 1] JP-A-2007-124624
[Patent document 2] JP-A-2007-124625
[Patent document 3] JP-A-2006-262104

By the way, the class-D amplifier may be required to have a power limit control function of limiting output power within a predetermined desired range for the volume control, etc., of a loudspeaker as a load depending on the intended purposes of the class-D amplifier. In a related class-D amplifier, a clamp circuit is provided in an input path of an input signal to a differential integrator for clamping the input signal so that the input signal input to the differential integrator does not exceed the desired level, thereby implementing the power limit control function. However, in such as configuration, the input signal input to the differential integrator is clamped by the clamp circuit, and thus there is a problem of occurrence of a large waveform distortion in the output signal of the class-D amplifier.

SUMMARY

In view of the circumstances described above, it is an object of the invention to provide a class-D amplifier capable of limiting an output power within a desired upper limit value without causing the large distortion to occur in the output signal waveform.

This invention provides a class-D amplifier comprising:
a differential integrator that integrates a difference between an input signal and a feedback signal to output an integration value signal;
a pulse width modulation circuit that outputs a digital signal having a pulse width corresponding to a level of the integration value signal;
an output buffer that drives a load based on the digital signal;
a feedback section that feeds an output signal of the output buffer into the differential integrator as the feedback signal;
a clamp section that performs a clamping of limiting the level of the integration value signal within a specified level range;
an attenuation section that attenuates the level of the input signal to be input to the differential integrator in response to an attenuation command; and
an attenuation control section that outputs the attenuation command to the attenuation section in response to the clamping performed by the clamp section.

According to the invention, the clamp section limits the level of the integration value signal within the clamp level range, so that a maximum value of a pulse width modulation degree of the output signal of the class-D amplifier can be set to a value corresponding to the clamp level and an output power of the class-D amplifier can be limited within the upper limit value corresponding to the clamp level. The attenuation section attenuates the input signal to be input to the differential integrator in response to the clamping performed by the clamp section. Therefore, large waveform distortion can be prevented from occurring in the output signal of the class-D amplifier.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Figure 1:
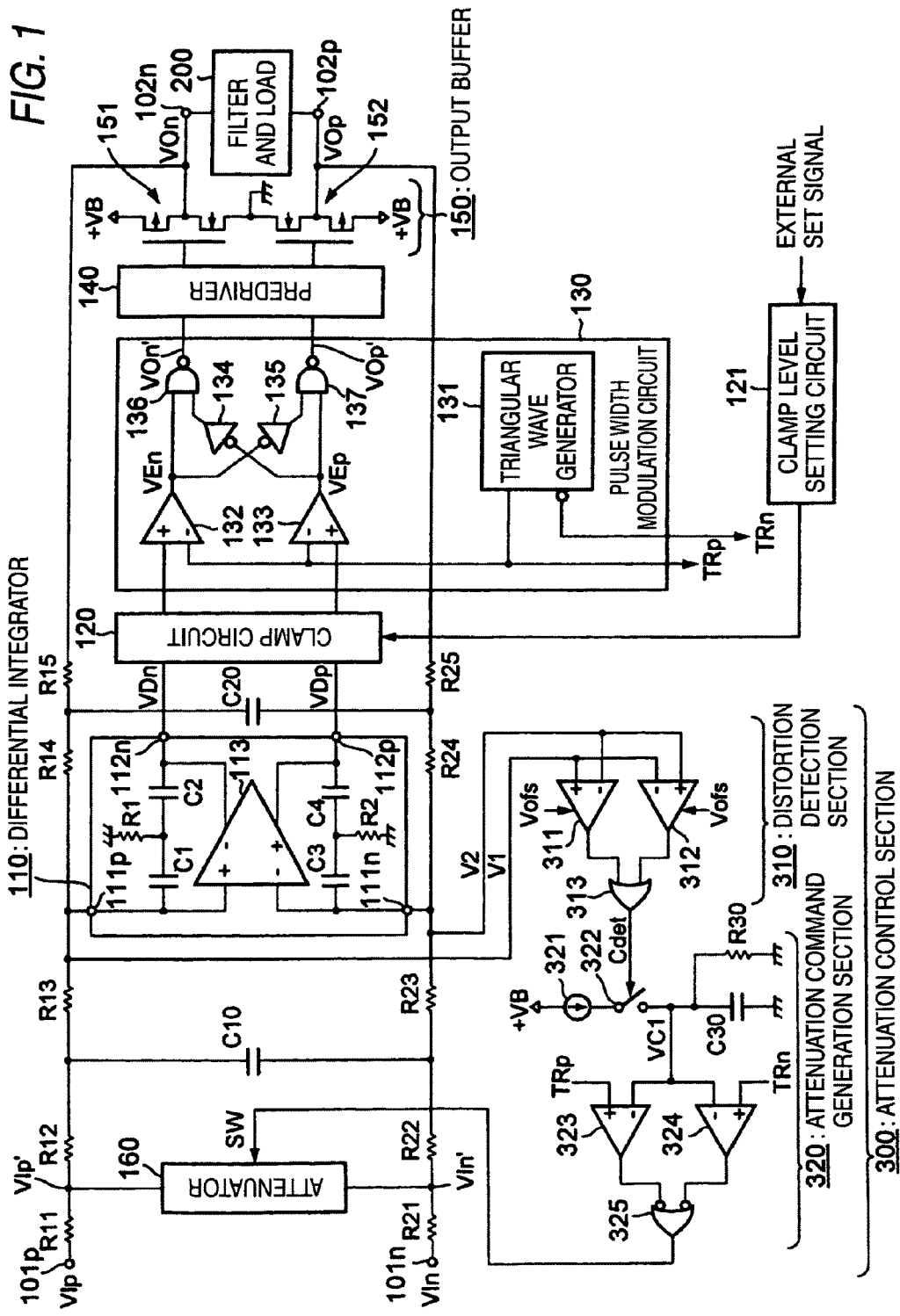
FIG. 1 is a circuit diagram to show the configuration of a class-D amplifier according to one embodiment of the invention.

An embodiment of the invention will be discussed below with reference to the accompanying drawings:

FIG. 1 is a circuit diagram to show the configuration of a class-D amplifier according to one embodiment of the invention. The class-D amplifier is a circuit for generating digital signals VOp and VOn of positive and negative two phases pulse-width-modulated in response to the levels of input analog signals VIp and VIn of positive and negative two phases input to input terminals 101p and 101n, and outputting the digital signals VOp and VOn from output terminals 102p and 102n. A filter and a load 200 such as a loudspeaker coil, etc., is arranged between the output terminals 102p and 102n. Resistors R11, R12, R13, R14, and R15 are arranged in series between the input terminal 101p and the output terminal 102n. Resistors R21, R22, R23, R24, and R25 are arranged in series between the input terminal 101n and the output terminal 102p. The resistance values of the resistors are satisfied as following relations: R11=R21, R12=R22, R13=R23, R14=R24, and R15=R25.

The positive-phase input analog signal VIp is input to a positive-phase input terminal 111p of a differential integrator 110 (an error integrator 110) through the resisters R11, R12, and R13, and the negative-phase input analog signal VIn is input to a negative-phase input terminal 111n of the differential integrator 110 through the resisters R21, R22, and R23. The negative-phase digital signal VOn is fed back into the positive-phase input terminal 111p of the differential integrator 110 through the resisters R15 and 14, and the positive-phase digital signal VOp is fed back into the negative-phase input terminal 111n of the differential integrator 110 through the resisters R25 and 24. The differential integrator 110 integrates differences of the input analog signals VIp and VIn and the digital signals VOp and VOn and outputs integration value signals VDp and VDn of positive and negative two phases indicating the integration result from a positive-phase output terminal 112p and a negative-phase output terminal 112n respectively.

In the input path of the input analog signals VIp and VIn to the differential integrator 110, a capacitor C10 is arranged between a common connection point of the resisters R12 and R13 and a common connection point of the resisters R22 and R23. The input path where the capacitor C10 is provided functions as a low-pass filter for removing high-frequency noise from the input signal in the process in which the input analog signals VIp and VIn are input to the differential integrator 110.

In the input path of the input analog signals VIp and VIn to the differential integrator 110, an attenuator 160 is arranged between a common connection point of the resisters R11 and R12 and a common connection point of the resisters R21 and R22. The attenuator 160 attenuates a level of the input signal to the differential integrator 110. The attenuator 160 in the embodiment is a switch configured by a MOSFET (Metal Oxide Semiconductor Field Effect Transistor), etc. The attenuator 160 is turned on when an attenuation command pulse SW is input to the attenuator 160, and intermittently attenuates the input analog signal. A control section for generating the attenuation command pulse SW is described later.

Various types of differential integrators can be applied as the differential integrator 10. In the example shown in the figure, a secondary differential integrator 110 including a differential amplifier 113, four capacitors C1 to C4, and two resisters R1 and R2 is used. Here, a positive-phase input terminal (+ input terminal) and a negative-phase input terminal (− input terminal) of the differential amplifier 113 serve as the positive-phase input terminal 111p and the negative-phase input terminal 111n of the differential integrator 110, and a positive-phase output terminal (+ output terminal) and a negative-phase output terminal (− output terminal) of the differential amplifier 113 serve as the positive-phase output terminal 112p and the negative-phase output terminal 112n of the differential integrator 110. The capacitors C1 and C2 for integrating differences (errors) is intervened in series between the positive-phase input terminal and the negative-phase output terminal of the differential amplifier 113, and a common connection point of the capacitors C1 and C2 is grounded through the resistor R1. The capacitors C3 and C4 for integrating differences is also intervened in series between the negative-phase input terminal and the positive-phase output terminal of the differential amplifier 113, and a common connection point of the capacitors C3 and C4 is grounded through the resistor R2.

A clamp circuit 120 clamps the integration value signals VDp and VDn so that each of the integration value signals VDp and VDn output by the differential integrator 110 does not exceed a preset upper limit clamp level UL or fall below a preset lower limit clamp level LL. A clamp level setting circuit 121 sets the upper limit clamp level UL and the lower limit clamp level LL of the clamp circuit 120 in response to an external set signal generated by operation of an operating unit (not shown) provided in a cabinet in which the class-D amplifier is housed, for example, or an external set signal supplied from an external apparatus of the class-D amplifier.

A pulse width modulation circuit 130 generates pulses VOp' and VOn' of two phases having a pulse widths corresponding to the levels of the integration value signals VDp and VDn supplied through the clamp circuit 120 from the differential integrator 110. In more detail, the pulse width modulation circuit 130 outputs a negative pulse VOp' having a pulse width corresponding to a level difference VDp−VDn when VDp>VDn. Also, the pulse width modulation circuit 130 outputs a negative pulse VOn' having a pulse width corresponding to a level difference VDn−VDp when VDn>VDp. A detailed configuration example of the pulse width modulation circuit 130 is described later.

A predriver 140 is a circuit for transmitting the pulses VOp' and VOn' output by the pulse width modulation circuit 130 to an output buffer 150, for example, it is a non-inverting buffer. The output buffer 150 has an inverter 151 and an inverter 152. As shown in FIG. 1, each of the inverters 151 and 152 is a known inverter, and has a p-channel MOSFET and an n-channel MOSFET intervened in series between power supply +VB and a ground. The inverter 151 inverts the level of the pulse VOn' supplied through the predriver 140 from the pulse width modulation circuit 130 and outputs the signal from the output terminal 102n as the digital signal VOn. The inverter 152 inverts the level of the pulse VOp' supplied through the predriver 140 from the pulse width modulation circuit 130 and outputs the signal from the output terminal 102p as the digital signal VOp.

In the feedback path of the digital signals VOp and VOn into the differential integrator 110 from the output buffer 150, a capacitor C20 is arranged between a common connection point of the resisters R15 and 14 and a common connection point of the resisters R25 and 24. The feedback path where the capacitor C20 is intervened functions as a low-pass filter for removing high-frequency noise from the feedback signal when the digital signals VOp and VOn are fed back into the differential integrator 110.

Figure 2:
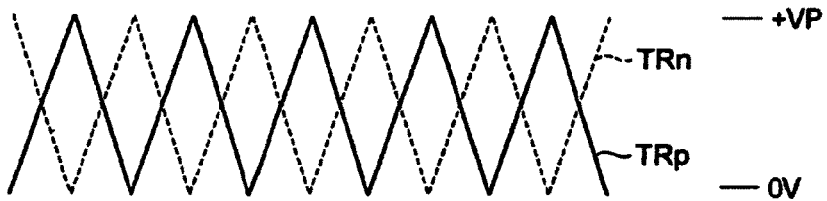
FIG. 2 is a drawing to show waveforms of triangular wave signals according to the embodiment of the invention.
Figure 3A:
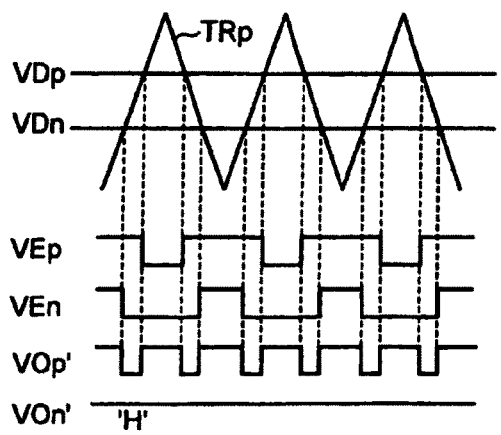
FIGS. 3A and 3B are drawings to show the signal waveforms of the components of a pulse width modulation circuit according to the embodiment of the invention.
Figure 3B:
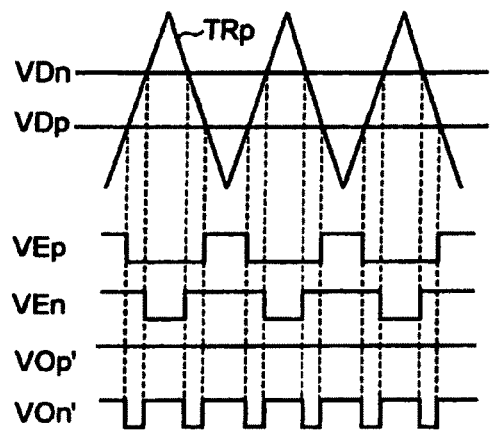

Next, a configuration example of the pulse width modulation circuit 130 will be discussed. In the example shown in FIG. 1, the pulse width modulation circuit 130 includes a triangular wave generator 131, comparators 132 and 133, inverters 134 and 135, and NAND gates 136 and 137. FIG. 2 is a drawing to show waveforms of triangular wave signals TRp and TRn (periodical signals) generated by the triangular wave generator 131. FIGS. 3A and 3B are drawings to show the signal waveforms of the components of the pulse width modulation circuit 130. FIG. 3A shows the signal waveform when VDp>VDn and FIG. 3B shows the signal waveform when VDn>VDp.

The triangular wave generator 131 generates the triangular wave signal TRp of a given period rising in a given gradient from a voltage 0 V to a predetermined voltage +VP and falling in a given gradient from the voltage +VP to the voltage 0 V, and also generates the triangular wave signal TRn of the opposite polarity to the triangular wave signal TRp, as shown in FIG. 2. The voltage +VP may be the same as or different from the power supply voltage +VB.

As shown in FIGS. 3A and 3B, the comparator 132 makes a comparison between the triangular wave signal TRp and the integration value signal VDn. The comparator 132 outputs a signal VEn having low level while the triangular wave signal TRp exceeds the integration value signal VDn, and outputs a signal VEn having high level while a period other than the above period that the triangular wave signal TRp exceeds the integration value signal VDn. The comparator 133 makes a comparison between the triangular wave signal TRp and the integration value signal VDp. The comparator 133 outputs a signal VEp having low level while the triangular wave signal TRp exceeds the integration value signal VDp, and outputs a signal VEp having high level while a period other than the above period that the triangular wave signal TRp exceeds the integration value signal VDp. The inverter 134 inverts the level of the signal VEp and outputs the inverted signal. The inverter 135 inverts the level of the signal VEn and outputs the inverted signal.

The NAND gate 136 operates a logical product of the signal VEn and the output signal of the inverter 134, thereby outputting the above-mentioned pulse VOn'. Here, the signal VEn becomes the high level while the triangular wave signal TRp does not exceed the integration value signal VDn, and the output signal of the inverter 134 becomes the high level while the triangular wave signal TRp exceeds the integration value signal VDp. Therefore, the NAND gate 136 outputs the negative pulse VOn' having the low level only while the signal value of the triangular wave signal TRp exists between VDn and VDp when VDn>VDp, as shown in FIG. 3B. That is, the NAND gate 136 outputs the pulse VOn' of the pulse width proportional to the level difference VDn-VDp when VDn>VDp.

The NAND gate 137 operates a logical product of the signal VEp and the output signal of the inverter 135, thereby outputting the above-mentioned pulse VOp'. Here, the signal VEp becomes the high level while the triangular wave signal TRp does not exceed the integration value signal VDp, and the output signal of the inverter 135 becomes the high level while the triangular wave signal TRp exceeds the integration value signal VDn. Therefore, the NAND gate 137 outputs the negative pulse VOp' having the low level only while the signal value of the triangular wave signal TRp exists between VDn and VDp when VDp>VDn, as shown in FIG. 3A. That is, the NAND gate 137 outputs the pulse VOp' of the pulse width proportional to the level difference VDp-VDn when VDp>VDn.

The pulse width modulation circuit 130 has been described in detail.

Figure 4:
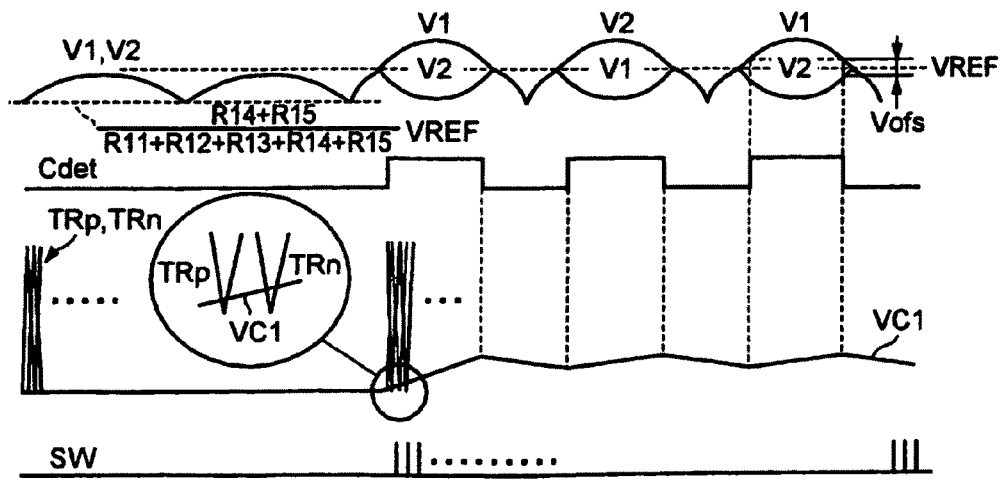
FIG. 4 is a drawing to show the signal waveforms of the components of an attenuation control section according to the embodiment of the invention.

Next, an attenuation control section 300 will be discussed. The attenuation control section 300 generates the attenuation command pulse SW and supplies the pulse to the attenuator 160 in response to clamping of the integration value signals VDp and VDn by the clamp circuit 120 and performs control of attenuating the input signal to the differential integrator 110. FIG. 4 is a drawing to show the signal waveforms of the components of the attenuation control section 300.

The attenuation control section 300 includes a distortion detection section 310 and an attenuation command generation section 320. The distortion detection section 310 detects whether or not distortion of a given amount occurs in the output waveform (which will be hereinafter referred to as load drive waveform) from the class-D amplifier to the filter and load 200 as the clamp circuit 120 clamps the integration value signal VDp or VDn based on input level V1 of the positive-phase input terminal 111p of the differential integrator 110 and input level V2 of the negative-phase input terminal 111n. The principle of distortion detection by the distortion detection section 310 is as follows:

A feedback signal of the level matched with the input signal to the differential integrator 110 is fed back into the input of the differential integrator 110 from the output terminals 102n and 102p in a state that the clamp circuit 120 does not perform the clamping of the integration value signals VDp and VDn. Thus, the differential integrator 110 operates in a state that it maintains the input level V1 of the positive-phase input terminal 111p and the input level V2 of the negative-phase input terminal 111n in the same voltage. In more detail, when the input signals VIp and VIn are at a reference level VREF of the operation point of the differential integrator 110, the input level V1 of the positive-phase input terminal 111p of the differential integrator 110 is determined by the following Equation (1).

$$V1 = \{(R14+R15)/(R11+R12+R13+R14+R15)\}VREF \quad \text{Equation (1)}$$

The input level V1 in Equation 1 is provided by dividing a difference voltage (=VREF) between voltage VIp (=VREF) and voltage VOn (=0 V) in a ground state by the resistors R11, R12, and R13 and the resistors R14 and R15.

Likewise, the input level V2 of the negative-phase input terminal 111n of the differential integrator 110 is determined by the following Equation (2).

$$V2 = \{(R24+R25)/(R21+R22+R23+R24+R25)\} \quad \text{Equation (2)}$$
$$VREF$$
$$= \{(R14+R15)/(R11+R12+R13+R14+R15)\}$$
$$VREF = V1$$

The input level V2 is provided by dividing difference voltage (=VREF) between voltage VIn (=VREF) and voltage VOp (=0 V) in a ground state by the resistors R21, R22, and R23 and the resistors R24 and R25.

In a state that the input signals VIp and VIn vibrate so as to become opposite phase to each other with the reference level VREF as the center and the amplitudes of the input signals VIp and VIn are small and clamping of the integration value signals VDp and VDn is not performed, the input levels V1 and V2 of the differential integrator 110 vibrate by voltages responsive to the amplitudes of the input signals VIp and VIn in the high potential direction from the input levels V1 and V2 determined by the above Equations (1) and (2) while maintaining the same level mutually, as shown in FIG. 4.

However, when the clamp circuit 120 clamps the integration value signal VDp or VDn, a feedback signal of the level matched with the input signal to the differential integrator 110 is not fed back into the input of the differential integrator 110 and the level of the input level becomes excessive large relative to the feedback signal. Thus, whenever the clamp circuit 120 clamps, a level difference responsive to the distortion amount of the load drive waveform generated by the clamping occurs between the input levels V1 and V2, as shown in FIG. 4.

If the level difference between the input levels V1 and V2 exceeds a given threshold value, the distortion detection section 310 outputs a distortion detection signal Cdet indicating that the distortion of a given amount occurs in the load drive waveform due to the clamp of the clamp circuit 120.

In the embodiment, the distortion detection section 310 includes comparators 311 and 312 and an OR gate 313. Here, the comparators 311 and 312 have an offset voltage Vofs corresponding to the threshold value between a positive-phase input terminal and a negative-phase input terminal. Voltage V1 is given to the positive-phase input terminal of the comparator 311, and voltage V2 is given to the negative-phase input terminal. When the voltage V1 of the positive-phase input terminal is higher than the voltage V2 of the negative-phase input terminal by the offset voltage Vofs or more, the comparator 311 outputs a high signal. Voltage V2 is given to the positive-phase input terminal of the comparator 312, and voltage V1 is given to the negative-phase input terminal. When the voltage V2 of the positive-phase input terminal is higher than the voltage V1 of the negative-phase input terminal by the offset voltage Vofs or more, the comparator 312 outputs a high signal. When the output signal of the comparator 311 or the output signal of the comparator 312 is high, namely, when the clamp circuit 120 clamps the integration value signal VDp or VDn, distortion of given amount occurs in the load drive waveform, and |V1−V2| exceeds the offset voltage Vofs as shown in FIG. 4, the OR gate 313 sets the distortion detection signal Cdet high (active level).

The attenuation command generation section 320 includes a constant current source 321, a switch 322, and a capacitor C30 intervened in series between power supply +VB and ground, a resistor R30 connected in parallel to the capacitor C30, comparators 323 and 324, and a low-active OR gate 325. The distortion detection signal Cdet is input to the switch 322. When the distortion detection signal Cdet becomes the high level, the switch 322 is turned on, and the capacitor C30 is charged by output current of the constant current source 321. The resistor R30 discharges the charge of the capacitor C30. While a triangular wave signal TRp is input to a positive-phase input terminal and voltage VC1 of the capacitor C30 is given to a negative-phase input terminal and the triangular wave signal TRp falls below the voltage VC1 of the capacitor C30, the comparator 323 outputs a low signal to the low-active OR gate 325. While a triangular wave signal TRn is input to a positive-phase input terminal and voltage VC1 of the capacitor C30 is given to a negative-phase input terminal and the triangular wave signal TRn falls below the voltage VC1 of the capacitor C30, the comparator 324 outputs a low signal to the low-active OR gate 325. Therefore, in each of the time period during which the triangular wave signal TRp falls below the voltage VC1 of the capacitor C30 and the time period during which the triangular wave signal TRn falls below the voltage VC1 of the capacitor C30, the low-active OR gate 325 generates an attenuation command pulse SW having the high level and supplies the attenuation command pulse SW to the attenuator 160 for turning on the attenuator 160 of a switch, as shown in FIG. 4.

The configuration of the class-D amplifier according to the embodiment has been described in detail.

Figure 5A:
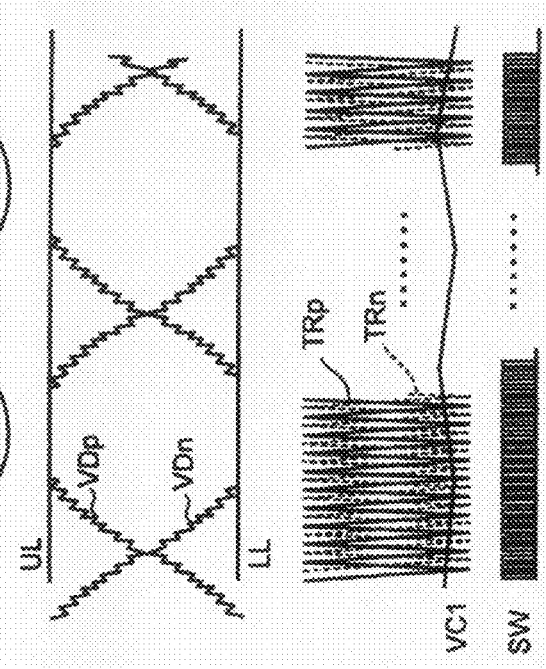
FIGS. 5A and 5B are drawings to show the signal waveforms of the components of the class-D amplifier according to the embodiment of the invention.
Figure 5A:
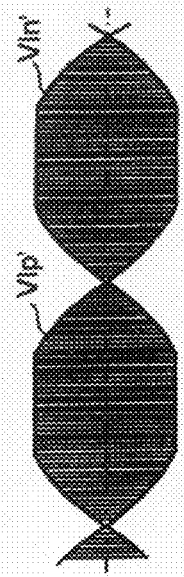
Figure 5B:
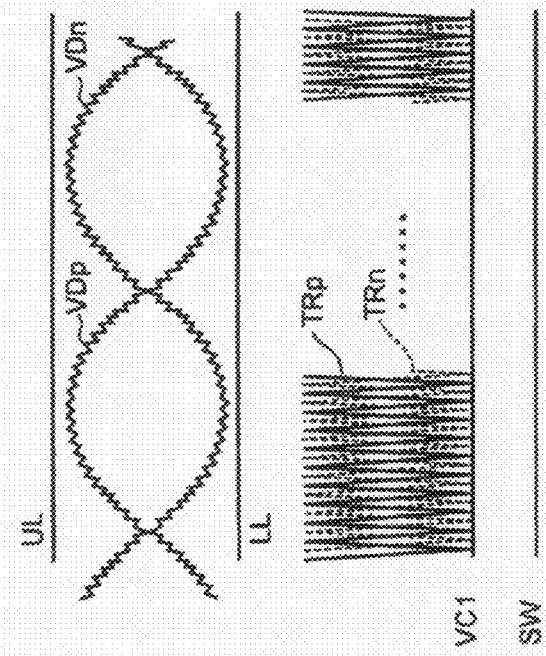
Figure 5B:
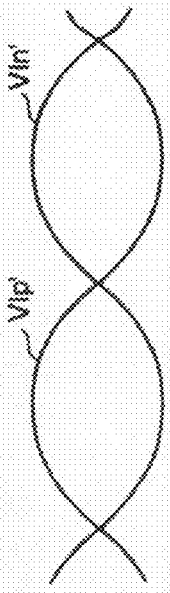

Next, the operation of the embodiment is as follows: FIGS. 5A and 5B are drawings to show the signal waveforms of the components of the class-D amplifier. As described above, the differential integrator 110 integrates differences of the input analog signal and the output digital signal. Thus, if the clamp circuit 120 does not clamp the integration value signals VDp and VDn, the integration value signals VDp and VDn provided by the differential integrator 110 become waveforms with a ripple corresponding to the output digital signal superposed on the waveforms of the input analog signals VIp and VIn.

In the example shown in FIG. 5A, since the levels of the input analog signals VIp and VIn are low, the integration value signals VDp and VDn exist within the range between the lower limit clamp level LL and the upper limit clamp level UL, and clamping of the integration value signals VDp and VDn by the clamp circuit 120 is not performed. The pulse width modulation circuit 130 compares the integration value signals VDp and VDn and the triangular wave signal TRp. While VDp>VDn, the pulse width modulation circuit 130 outputs a positive pulse of the pulse width responsive to VDp−VDn as a digital signal VOp and sets a digital signal VOn continuously low. While VDn>VDp, the pulse width modulation circuit 130 generates a positive pulse of the pulse width responsive to VDn−VDp as the digital signal VOp and sets the digital signal VOn continuously low.

The digital signals VOp and VOn of the pulse widths responsive to the levels of the input analog signals VIp and VIn are provided in a state that clamping of the integration value signals VDp and VDn by the clamp circuit 120 is not performed. Thus, the input signal and the feedback signal are balanced in the differential integrator 110 and the differential integrator 110 maintains the level V1 of the positive-phase input terminal and the level V2 of the negative-phase input terminal at the same level and operates. In this state, the distortion detection signal Cdet becomes the low level in the distortion detection section 310 and the voltage VC1 of the capacitor C30 becomes 0 V in the attenuation command generation section 320, and thus no attenuation command pulse SW is generated. Thus, the waveforms of analog signals VIp' and VIn' appearing across the attenuator 160 become similar waveforms provided by multiplying the input analog signals VIp and VIn by a predetermined coefficient.

However, when the levels of the input analog signals VIp and VIn become high, the integration value signals VDp and VDn output by the differential integrator 110 soon reach the clamp levels LL and UL and the clamp circuit 120 clamps the integration value signals VDp and VDn as illustrated in FIG. 5B. When the clamp circuit 120 clamps the integration value signals VDp and VDn, in the differential integrator 110, the input signal becomes excessive relative to the feedback signal and a level difference between the level V1 of the positive-phase input terminal and the level V2 of the negative-phase input terminal occurs. Whenever the clamp circuit 120 clamps and the level difference |V1−V2| exceeds the offset voltage Vofs, the distortion detection signal Cdet becomes the high level in the distortion detection section 310 and the voltage VC1 of the capacitor C30 rises in the attenuation command generation section 320 and thus an attenuation command pulse SW is generated in synchronization with each peak point of the triangular wave signals TRp and TRn. Consequently, the analog signals VIp' and VIn' across the attenuator 160 become the signal values corresponding to the original input analog signals VIp and VIn while the attenuation command pulse SW is the low level, and the analog signals VIp' and VIn' become 0 V while the attenuation command pulse SW is the high level. Therefore, the analog signals VIp' and VIn' become waveforms as they are thinned out at given time intervals as shown in the figure. Therefore, the analog signal substantially input to the differential integrator 110 is attenuated, and the integration value signals VDp and VDn are reduced so as to provide a given distortion amount.

In more detail, in a situation that the amplitudes of the input analog signals VIp and VIn become large and the clamp operation is performed so as to limit the amplitudes of the integration value signals VDp and VDn within the range from the lower limit clamp level LL to the upper limit clamp level UL, as the amplitudes of the input analog signals VIp and VIn become larger, the pulse width of the attenuation command pulse SW is made large, the thinning-out rate is increased, and the gain as the whole class-D amplifier is decreased; this means that negative feedback control is performed. Such negative feedback control works, so that the gain as the whole class-D amplifier is adjusted to the optimum value so that the pulse width modulation degree of the output digital signals VOp and VOn falls within one upper limit value. The upper limit value of the pulse width modulation degree of the output digital signals VOp and Von depends on the lower limit clamp level LL and the upper limit clamp level UL. The reason why the upper limit value depends on the upper and lower limit clamp levels is as follows. In the class-D amplifier according to the embodiment, the pulse width modulation degree of the output digital signals VOp and VOn is determined in response to the levels of the integration value signals VDp and VDn output by the differential integrator 110. On the other hand, when the integration value signals VDp and VDn exceed the range from the lower limit clamp level LL to the upper limit clamp level UL, the integration value signals VDp and VDn are clamped, an attenuation command pulse SW for thinning out is generated, and an increase in the levels of the integration value signals VDp and VDn and an increase in the pulse width modulation degree accompanying this are suppressed.

The response characteristic of the attenuation command pulse SW in response to the clamp operation in the embodiment can be adjusted according to the capacitance value of the capacitor C30 and the resistance value of the resistor R30. When it is necessary to generate an attenuation command pulse SW in a short time for occurrence of the clamp operation, the capacitance value of the capacitor C30 may be reduced. After the clamp state is canceled, when it is necessary to prolong the time until the attenuation command pulse SW is stopped, the resistance value of the resistor R30 may be increased. The capacitance value of the capacitor C30 and the resistance value of the resistor R30 can be adjusted by operating of an operating unit.

As described above, according to the embodiment, when the integration value signals VDp and VDn output by the differential integrator 110 exceed the range of the lower limit clamp level LL to the upper limit clamp level UL, the integration value signals VDp and VDn are clamped, and then the operation of thinning out the analog signal input to the differential integrator 110 intermittently on the time axis is performed in response to the clamping, and the gain of the class-D amplifier is decreased. In this case, the analog signal input to the differential integrator 110 is thinned out intermittently, the maximum pulse width modulation degree of the output digital signals VOp and VOn of the class-D amplifier can be set to any desired value, and the output power can be limited within any desired range.

The embodiment has the advantage that the maximum pulse width modulation degree is limited by clamping the integration value signals VDp and VDn, so that the maximum pulse width modulation degree can be limited with good accuracy. For limiting the maximum pulse width modulation degree, clamping a signal on the input side of the differential integrator 110, for example, the signal across the capacitor C10 is considered. In the embodiment, however, a switch is used as the attenuator 160 and the configuration in which the switch is turned on/off for attenuating the input signal to the differential integrator 110 is adopted and thus noise involved in on/off switching of the attenuator 160 of the switch is superposed on the signal across the capacitor C10. Moreover, the amplitude of the noise changes depending on the pulse width of the attenuation command pulse SW and the input signal amplitude. Thus, if the signal across the capacitor C10 is clamped, clamping with good accuracy cannot be performed and the attenuation amount given to the input signal to the differential integrator 110 cannot precisely controlled. In contrast, in the embodiment, the integration value signals VDp and VDn are clamped, whereby the maximum pulse width modulation degree is limited. A ripple involved in feedback of the output digital signals VOp and VOn of the class-D amplifier is superposed on the integration value signals VDp and VDn, but the amplitude of the ripple is comparatively small and does not depend on the pulse width of the attenuation command pulse SW. Therefore, according to the embodiment, the maximum pulse width modulation degree can be limited to a value responsive to the clamp level with good accuracy.

Other Embodiments

While the embodiment of the invention has been described, other various embodiments of the invention are possible, for example, as follows:
(1) In the embodiment described above, the invention applies to the balanced type class-D amplifier of the differential configuration, but can also be applied to a non-balanced type class-D amplifier of a non-differential configuration, of course.
(2) In the embodiment described above, clamping of the clamp circuit 120 is detected based on the level difference between the positive-phase input terminal and the negative-phase input terminal of the differential integrator 110, but may be detected according to any other method. For example, the following configuration is also considered. As the clamp circuit 120, cathodes of two diodes are connected to signal lines where the integration value signals VDp and VDn are output, anodes of both the diodes are connected to a constant voltage source for outputting a voltage higher by the forward voltage of the diode than the lower limit clamp level LL, anodes of two different diodes are connected to signal lines where the integration value signals VDp and VDn are output, and cathodes of both the diodes are connected to a constant voltage source for outputting a voltage lower by the forward voltage of the diode than the upper limit clamp level UL. In the described clamp circuit 120, when the integration value signals VDp and VDn exceed the range of the lower limit clamp level LL to the upper limit clamp level UL and clamping is performed, a current flows into the constant voltage source through the diode. Clamping of the clamp circuit 120 may be detected by detecting the current.
(3) The capacitance value of the capacitor C30, the resistance value of the resistor R30, the current value of the constant current source 321 in the attenuation command generation section 320 or the offset voltage Vofs of the comparators 311 and 312 may be able to be adjusted by operating of an operating unit, etc. According to this configuration, the degree of clamping of the integration value signals VDp and VDn when output of the attenuation command pulse SW is started (for example, the time for which the integration value signals VDp and VDn maintain the clamp level) can be controlled by operating the operating unit, etc., and it is made possible to control to what degree that waveform distortion of the output signal of the class-D amplifier is allowed.

Followings are summarization of the above embodiment.
A class-D amplifier comprises:
a differential integrator that integrates a difference between an input signal and a feedback signal to output an integration value signal;
a pulse width modulation circuit that outputs a digital signal having a pulse width corresponding to a level of the integration value signal;
an output buffer that drives a load based on the digital signal;
a feedback section that feeds an output signal of the output buffer into the differential integrator as the feedback signal;
a clamp section that performs a clamping of limiting the level of the integration value signal within a specified level range;
an attenuation section that attenuates the level of the input signal to be input to the differential integrator in response to an attenuation command; and
an attenuation control section that outputs the attenuation command to the attenuation section in response to the clamping performed by the clamp section.

Preferably, the attenuation section has a switch which switches supply and shutoff of the input signal to the differential integrator in response to the attenuation command.

Preferably, the pulse width modulation circuit compares a triangular wave signal with the integration value signal to generate the digital signal.

Preferably, the attenuation control section outputs the attenuation command to the attenuation section in response to a distortion occurring in a drive waveform for driving the load output by the output buffer due to the clamping performed by the clamp section.

Preferably, the class-D amplifier further comprises a clamp level setting circuit that sets an upper limit clamp level and a lower limit clamp level of the specified level range in the clamp section.

Preferably, an upper limit value of a pulse width modulation degree of the digital signal depends on the upper limit clamp level and the lower limit clamp level of the specified level range.

Preferably, the class-D amplifier further comprises a response characteristic adjusting section that adjusts a response characteristic of the attenuation command in response to the clamping performed by the clamp section.

The present application is based on Japanese Patent Application No. 2009-045306 filed on Feb. 27, 2009, the contents of which are incorporated herein for reference.

What is claimed is:

1. A class-D amplifier comprising:
  a differential integrator that integrates a difference between an input signal and a feedback signal to output an integration value signal;
  a pulse width modulation circuit that outputs a digital signal having a pulse width corresponding to a level of the integration value signal;
  an output buffer that drives a load based on the digital signal;
  a feedback section that feeds an output signal of the output buffer into the differential integrator as the feedback signal;
  a clamp section that performs a clamping of limiting the level of the integration value signal within a specified level range;
  an attenuation section that attenuates the level of the input signal to be input to the differential integrator in response to an attenuation command; and
  an attenuation control section that outputs the attenuation command to the attenuation section in response to the clamping performed by the clamp section.

2. The class-D amplifier according to claim 1, wherein the attenuation section has a switch which switches supply and shutoff of the input signal to the differential integrator in response to the attenuation command.

3. The class-D amplifier according to claim 1, wherein the pulse width modulation circuit compares a triangular wave signal with the integration value signal to generate the digital signal.

4. The class-D amplifier according to claim 1, wherein the attenuation control section outputs the attenuation command to the attenuation section in response to a distortion occurring in a drive waveform for driving the load output by the output buffer due to the clamping performed by the clamp section.

5. The class-D amplifier according to claim 1, further comprising:
  a clamp level setting circuit that sets an upper limit clamp level and a lower limit clamp level of the specified level range in the clamp section.

6. The class-D amplifier according to claim 5, wherein an upper limit value of a pulse width modulation degree of the digital signal depends on the upper limit clamp level and the lower limit clamp level of the specified level range.

7. The class-D amplifier according to claim 1, further comprising:
  a response characteristic adjusting section that adjusts a response characteristic of the attenuation command in response to the clamping performed by the clamp section.

* * * * *